United States Patent
Lin et al.

[11] Patent Number: 6,165,913
[45] Date of Patent: *Dec. 26, 2000

[54] MANUFACTURING METHOD FOR SPACER

[75] Inventors: Tony Lin, Kao Hsiung Hsien; Heng-Sheng Huang, Taipei, both of Taiwan

[73] Assignee: United Microelectronics Corp., Hsin-chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/957,922

[22] Filed: Oct. 27, 1997

[30] Foreign Application Priority Data

Sep. 1, 1997 [TW] Taiwan .................................. 86112499

[51] Int. Cl.⁷ ...................... H01L 21/3205; H01L 21/308
[52] U.S. Cl. .......................... 438/761; 438/303; 438/305; 438/696
[58] Field of Search .................................. 438/303, 305, 438/595, 696

[56] References Cited

U.S. PATENT DOCUMENTS

| | | | |
|---|---|---|---|
| 4,488,351 | 12/1984 | Momose | 29/578 |
| 4,951,100 | 8/1990 | Parrillo | 357/233 |
| 5,015,598 | 5/1991 | Verhaar | 437/44 |
| 5,573,965 | 11/1996 | Chen et al. | 437/41 |
| 5,679,589 | 10/1997 | Lee et al. | 437/40 GS |
| 5,783,475 | 7/1998 | Ramaswami | 438/303 |
| 5,827,769 | 10/1998 | Aminzadeh et al. | 438/305 |
| 6,004,852 | 12/1999 | Yeh | 438/305 |
| 6,013,569 | 12/1999 | Lur | 438/595 |

OTHER PUBLICATIONS

Wolf, Stanley, Silicon Processing for the VLSI Era, vol. 3, p. 608–611 1995.
Wolf, Stanley, Silicon Processing for the VLSI Era, vol. 1, p. 184, 1986.
Wolf, Stanley, Silicon Processing for the VLSI Era, vol. 1, p. 556, 1986.

*Primary Examiner*—Charles Bowers
*Assistant Examiner*—Lisa Kilday
*Attorney, Agent, or Firm*—Finnegan, Henderson, Farabow, Garrett & Dunner, L.L.P.

[57] ABSTRACT

A method for manufacturing spacers comprising the steps of first providing a semiconductor substrate having a gate electrode already formed thereon, and then sequentially depositing oxide, silicon nitride and oxide over the gate electrode and the substrate to form a first oxide layer, a silicon nitride layer and a second oxide layer. Subsequently, the second oxide layer is etched to form an oxide spacer above the silicon nitride layer. Thereafter, using the oxide spacer as a mask, a dry etching method having a high etching selectivity ratio for silicon nitride/oxide is used to etch the silicon nitride layer to form a silicon nitride spacer. Finally, the oxide spacer is removed using an oxide dip method. The silicon nitride spacers of this invention can have a greater thickness, more thickness uniformity, and a higher reliability for hot carriers. In addition, the method used in the invention can have a better control over the thickness.

27 Claims, 3 Drawing Sheets

MANUFACTURING METHOD FOR SPACER

BACKGROUND OF THE INVENTION

1. Field of Invention

The present invention relates to a manufacturing method for a semiconductor device. More particularly, the present invention relates to the manufacturing of spacers whose thickness can be controlled and having a better reliability for hot carriers.

2. Description of Related Art

As the level of integration for integrated circuits is increased, device dimensions must be reduced, and channel length must also be reduced correspondingly. However, when the channel length is reduced to a certain extent, various kinds of problems will start to appear. One such problem is the so-called short channel effect, and a lightly doped drain (LDD) design is extensively used to deal with this problem. In the LDD design, lightly doped regions are formed in the source/drain region next to the channel region of a metal oxide semiconductor (MOS).

The LDD design requires the formation of spacers surrounding the gate electrode. Usually, silicon dioxide is the material for forming the spacers in a conventional method. However, due to the moisture absorption property and ability to trap hot carriers in trap centers for conventional silicon dioxide spacers, reliability of hot carriers is lowered. Despite the emergence of silicon nitride (SiN) spacers, which have better properties than the silicon dioxide spacers, there are other problems associated with silicon nitride spacers too. For a start, the amount of silicon nitride that needs to be etched is difficult to control with the conventional method. Therefore, thickness of the silicon nitride spacer can vary by quite an amount leading to thinner spacer and non-uniformity problems.

FIGS. 1A through 1C are cross-sectional views showing the progression of manufacturing steps in the fabrication of conventional spacers. First, as shown in FIG. 1A, a semiconductor substrate 10 is provided. Then, a field oxide layer 11 for defining the active device area 12 is formed over the substrate 10. Thereafter, an oxide layer and a polysilicon layer are sequentially formed over the active device region 12 of the substrate 10. The oxide layer can be, for example, a silicon dioxide layer. In a subsequent step, the oxide layer and the polysilicon layer are patterned to form a gate oxide layer 13 and a gate electrode 14. Then, a photoresist layer (not shown in the FIG.) is formed over the gate electrode 14. Next, ions having a low concentration level is implanted into the active device regions 12 forming lightly doped source/drain regions 15. Then, the photoresist layer is removed.

Next, in FIG. 1B, a layer of spacer material 16a is deposited over the active device regions 12 of the substrate 10 and the gate electrode 14 using a chemical vapor deposition method. The spacer can be, for example, silicon dioxide or silicon nitride having a thickness of about 100 Å to 400 Å.

Finally, in FIG. 1C, a photoresist layer (not shown in the FIG.) is coated over the gate electrode 14, and then an ion implantation operation is performed using the spacers 16b as masks. Through the implantation, ions having a high concentration level are implanted into the active device regions 12 forming heavily doped source/drain regions 17.

However, if the spacer material is silicon dioxide, due to the moisture absorbing and hot carriers trapping properties of silicon dioxide, reliability of hot carriers will be somewhat lower. On the other hand, if the spacer is silicon nitride, the defects arising from the use of a silicon dioxide layer can be improved leading to a better reliability for the hot carriers. Yet, using a conventional method to manufacture a silicon nitride spacer, the amount of silicon nitride to be etched is still very difficult to control. Therefore, the correct thickness for a silicon nitride spacer is difficult to obtain and thereby leading to problems such as spacers that are too thin and have thickness that are not uniform.

In light of the foregoing, there is a need in the art for improving the method of forming spacers.

SUMMARY OF THE INVENTION

Accordingly, the present invention is directed to provide a manufacturing method for silicon nitride spacers that has a greater thickness, more thickness uniformity, higher hot carrier reliability, and a better control of thickness than the conventional method.

To achieve these and other advantages and in accordance with the purpose of the invention, as embodied and broadly described herein, the invention provides a method for manufacturing spacers. The method comprises the steps of first providing a semiconductor substrate having field oxide layer already formed thereon for defining active device region, and a gate oxide layer and a gate electrode formed above the active device region. Thereafter, lightly doped source/drain regions are formed above the device region. Then, an oxide layer, a silicon nitride layer and another oxide layer are deposited sequentially over the gate electrode and the substrate using a chemical vapor deposition method. Thus, a composite stack of a first oxide layer, a silicon nitride layer and a second oxide layer is formed. Next, the second oxide layer is anisotropically etched to form an oxide spacer above the silicon nitride layer using an anisotropic dry etching method.

Next, using the oxide spacer as a mask, the silicon nitride layer above the first oxide layer is anisotropically etched to form a silicon nitride spacer using an anisotropic etching method that has a high nitride/oxide selectivity ratio. Then, the oxide spacer and portions of the first oxide layer is removed to expose the gate electrode and the substrate in the device region using an oxide dip method. Subsequently, a photoresist layer is formed over the gate electrode. Using the silicon nitride spacer as a mask, an ion implantation is preformed by implanting dopants having a high concentration level into the exposed device regions to form heavily doped source/drain regions.

The first characteristic of this invention is that during the step of etching the silicon nitride layer to form a silicon nitride spacer, the oxide spacer is capable of protecting the silicon nitride layer. Therefore, not only the thickness of the silicon nitride spacer can be controlled, but also a greater thickness and thickness uniformity for the silicon nitride spacer can be obtained.

The second characteristic of this invention is that a silicon nitride spacer is capable of improving the reliability of hot carriers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in to constitute part of this specification. The drawings illustrate embodiments of the invention and, together with the description, serve to explain the principles of the invention. In the drawings.

DESCRIPTION OF THE PREFERRED EMBODIMENTS

Figure 1A:
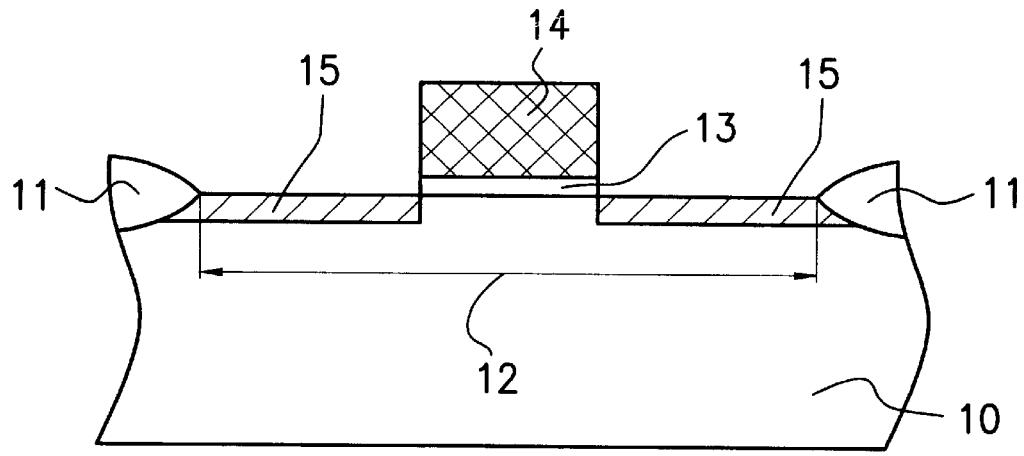
FIGS. 1A through 1C are cross-sectional views showing the progression of manufacturing steps in the fabrication of conventional spacers.
Figure 1B:
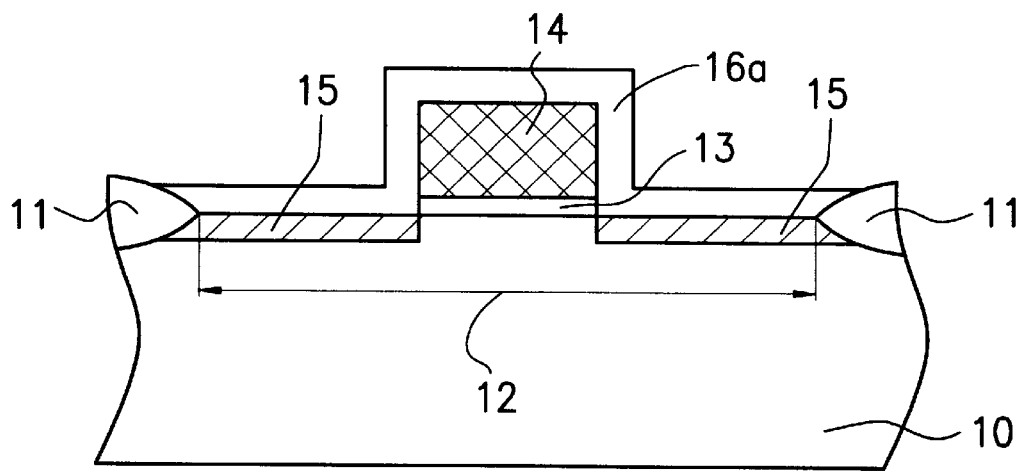
Figure 1C:
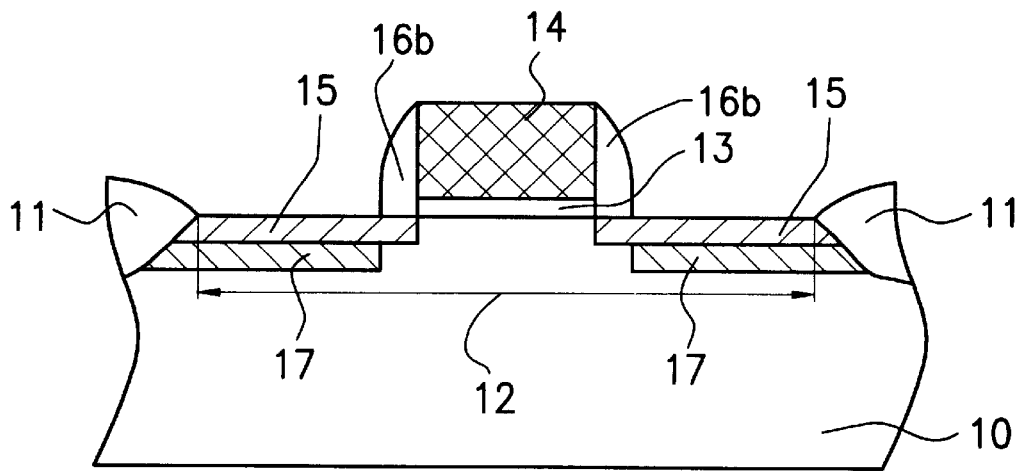

Reference will now be made in detail to the present preferred embodiments of the invention, examples of which are illustrated in the accompanying drawings. Wherever possible, the same reference numbers are used in the drawings and the description to refer to the same or like parts.

Figure 2A:
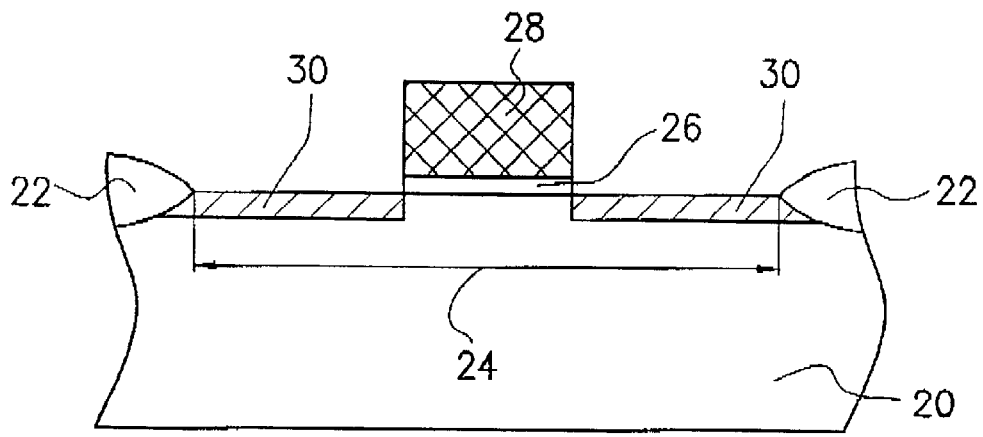
FIGS. 2A through 2E are cross-sectional views showing the progression of manufacturing steps in the fabrication of spacers according to one preferred embodiment of this invention.

FIGS. 2A through 2E are cross-sectional views showing the progression of manufacturing steps in the fabrication of spacers according to one preferred embodiment of this invention. First, as shown in FIG. 2A, a semiconductor substrate is provided. Then, a field oxide layer 22 for defining the active device area 24 is formed over the substrate 20. Thereafter, an oxide layer and a polysilicon layer are sequentially formed over the active device region 24 of the substrate 20. In a subsequent step, the oxide layer and the polysilicon layer are patterned to form a gate oxide layer 26 and a gate electrode 28 having a top surface. Then, a photoresist layer (not shown in the FIG.) is formed over the gate electrode 28. Next, ions having a low concentration level is implanted into the active device regions 24 forming lightly doped source/drain regions 30. Then, the photoresist layer is removed.

Figure 2B:
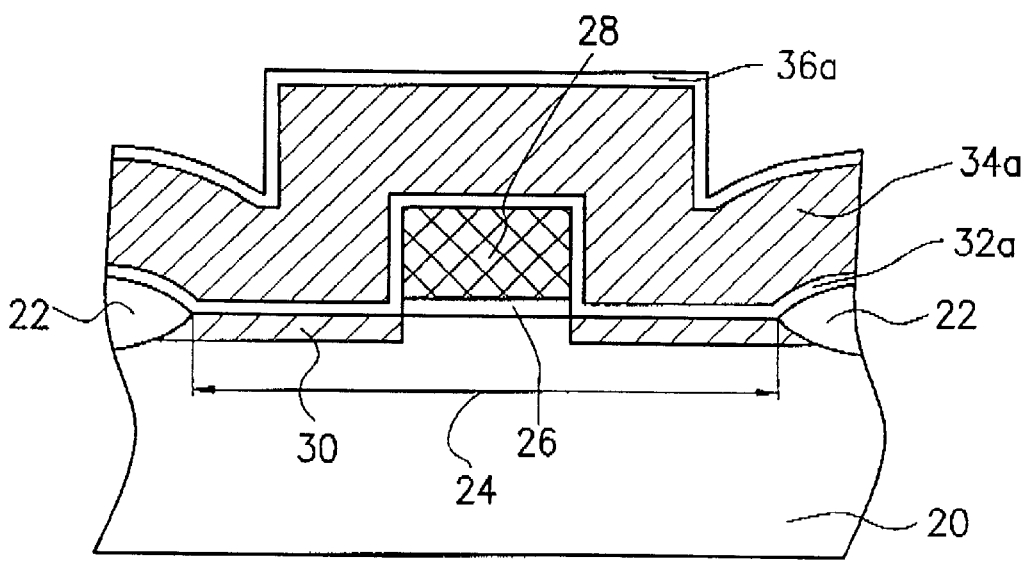

Next, in FIG. 2B, oxide is deposited over the gate electrode 28 and the lightly doped source/drain regions 30 to form a first oxide layer 32a using a chemical vapor deposition method. The first oxide layer 32a, for example, can be a silicon dioxide layer and preferably has a thickness of about 100 Å to 400 Å. Silicon nitride (SiN) is then deposited over the first oxide layer 32a to form a silicon nitride layer 34a using a chemical vapor deposition method. The silicon nitride layer 34a preferably has a thickness of about 1000 Å to 2000 Å. Thereafter, another oxide layer is deposited over the silicon nitride layer 34a to form a second oxide layer 36a using a chemical vapor deposition method. The second oxide layer 36a, for example, can be a silicon dioxide and preferably has a thickness of about 100 Å to 400 Å.

Figure 2C:
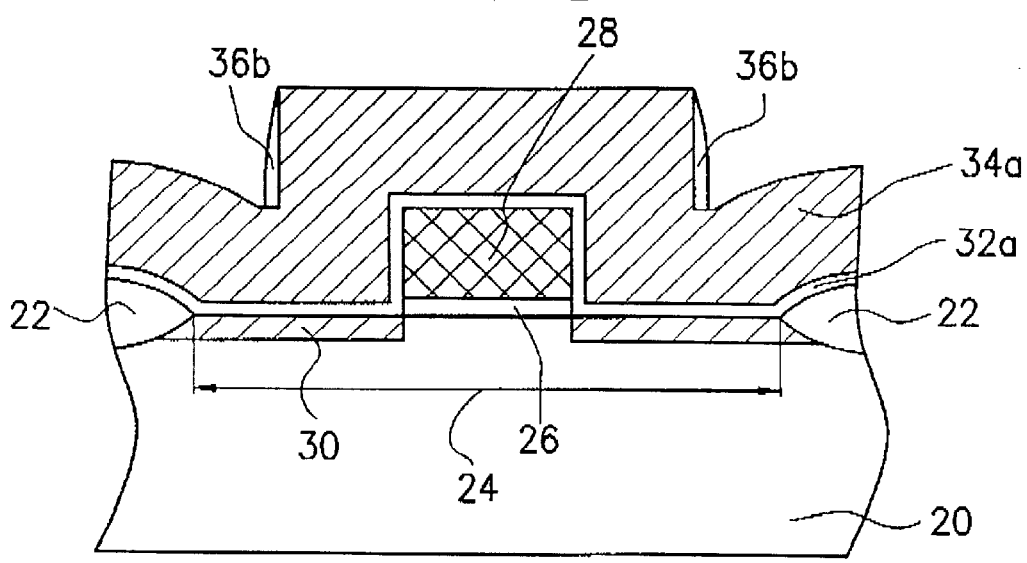

Next, as shown in FIG. 2C, the second oxide layer 36a is anisotropically etched to form an oxide spacer 36b having a bottom surface and defining a longitudinal axis above the silicon nitride layer 34a and around the gate electrode 28 using an anisotropic dry etching method.

Figure 2D:
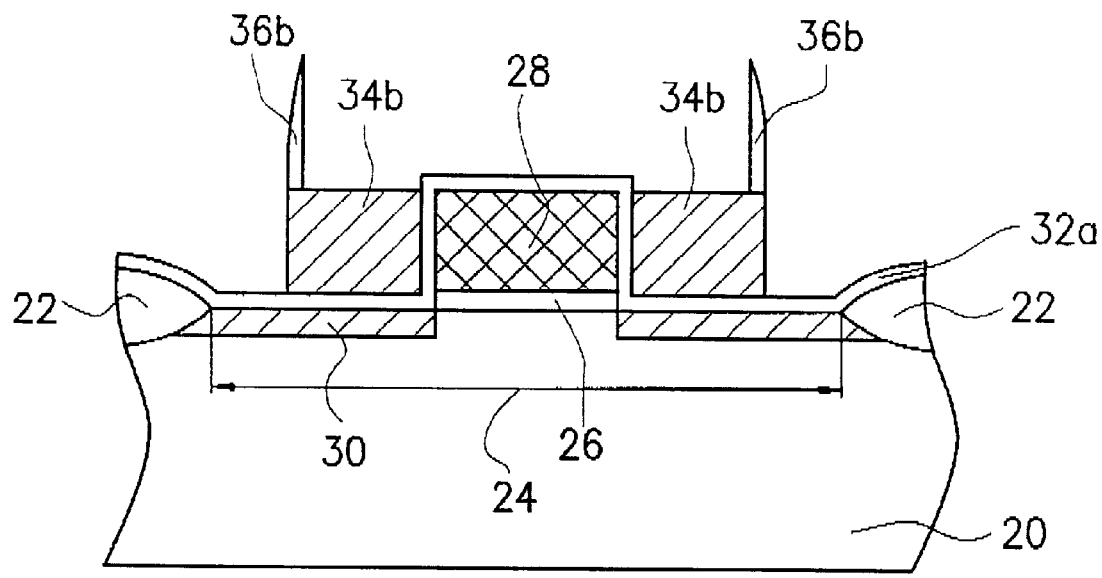

Next, as shown in FIG. 2D, using the oxide spacer 36b as a mask, the silicon nitride layer 34a is etched anisotropically to form a silicon nitride spacer 34b above the first oxide layer 32a and around the gate electrode 28 using a dry etching method. The dry etching method used in the above has a high etching selectivity ratio between silicon nitride and oxide. In other words, the etching rate for silicon nitride is higher than the etching rate for oxide. Therefore, oxide spacers 36b will remain after the etching operation.

Figure 2E:
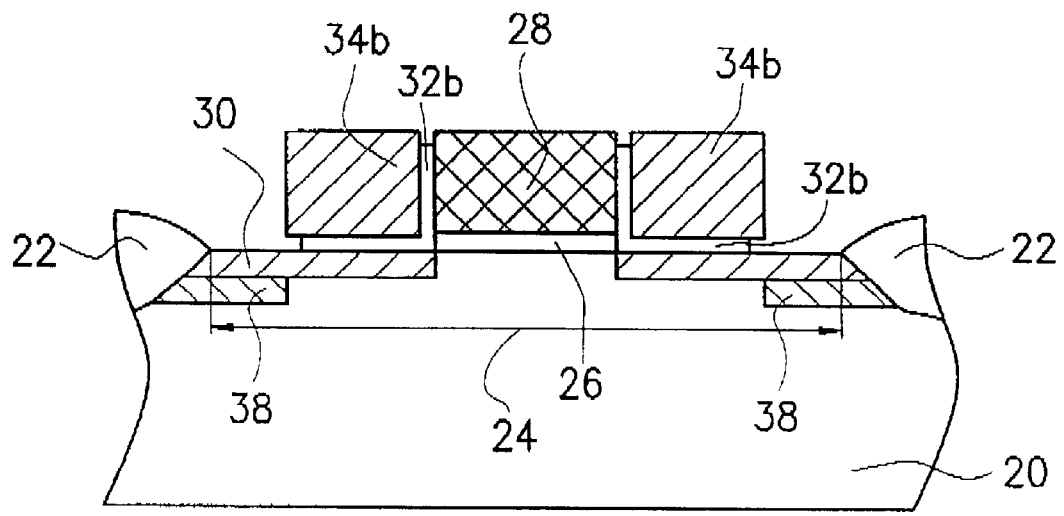

Finally, as shown in FIG. 2E, the oxide spacer 36b is removed by an oxide dip method. Because the oxide dip method is a kind of wet etching method, the first oxide layer 32b above the gate electrode 28 and the device regions 24 will also be removed exposing the substrate 20 and the gate electrode 28. Lastly, using the silicon nitride spacer 34b as a mask, an ion implantation is performed implanting dopants having a high concentration level into the exposed device regions to form heavily doped source/drain regions 38.

The first characteristic of this invention is that during the step of etching the silicon nitride layer to form a silicon nitride spacer 34b as shown in FIG. 2D, the oxide spacer 36b is capable of protecting the silicon nitride layer. Therefore, not only the thickness of the silicon nitride spacer can be controlled, but also a greater thickness and thickness uniformity for the silicon nitride spacer can be obtained.

The second characteristic of this invention is that a silicon nitride spacer is capable of improving the reliability of hot carriers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming spacers, comprising the steps of:
    (a) providing a semiconductor substrate having a gate oxide layer and a gate electrode formed thereon;
    (b) forming a stack including a first oxide layer, a silicon nitride layer and a second oxide layer over the gate electrode and the substrate;
    (c) etching the second oxide layer to form an oxide spacer over the silicon nitride layer, wherein a bottom surface of the oxide spacer is placed substantially at a level equal with a top surface of the gate electrode;
    (d) using the oxide spacer as a mask, etching the silicon nitride layer to form a silicon nitride spacer over the first oxide layer and around the gate electrode to expose the first oxide layer, wherein the silicon nitride spacer is not removed in any subsequent step; and
    (e) removing the oxide spacer and the exposed first oxide layer.

2. The method of claim 1, wherein after step (a), further includes the step of performing an ion implantation operation to form lightly doped source/drain regions in the substrate.

3. The method of claim 1, wherein in step (b), the method of forming the first oxide layer, the silicon nitride layer and the second oxide layer includes using a chemical vapor deposition method.

4. The method of claim 1, wherein in step (b), the silicon nitride layer is formed above the first oxide layer.

5. The method of claim 1, wherein in step (b), the second oxide layer is formed above the silicon nitride layer.

6. The method of claim 1, wherein in step (b), the second oxide layer is formed above the first oxide layer.

7. The method of claim 1, wherein in step (c), the second oxide layer is etched using a dry etching method.

8. The method of claim 1, wherein in step (d), the silicon nitride layer is etched using a dry etching method that has a higher etching rate for silicon nitride than for oxide.

9. The method of claim 1, wherein in step (e), the oxide spacer is removed using a wet etching method.

10. The method of claim 1, wherein in step (e), the oxide spacer is removed using an oxide dip method.

11. The method of claim 1, wherein in step (e), further includes the step of removing the first oxide layer above the gate electrode and the substrate to expose the substrate and the gate electrode.

12. The method of claim 1, wherein the step of forming the first oxide layer includes depositing oxide to a thickness of about 100 Å to 400 Å.

13. The method of claim 1, wherein the step of forming the first oxide layer includes depositing oxide.

14. The method of claim 1, wherein the step of forming the first oxide layer includes depositing silicon dioxide.

15. The method of claim 1, wherein the step of forming the silicon nitride layer includes depositing silicon nitride to a thickness of about 1000 Å to 2000 Å.

16. The method of claim 1, wherein the step of forming the second oxide layer includes depositing oxide to a thickness of about 1000 Å to 400 Å.

17. The method of claim 1, wherein the step of forming the second oxide layer includes depositing oxide.

18. The method of claim 1, wherein the step of forming the second oxide layer includes depositing silicon dioxide.

19. A method for forming spacers, comprising the steps of:

(a) providing a semiconductor substrate having an isolation structure, a gate oxide layer and a gate electrode thereon;

(b) forming a stack including a first oxide layer, a silicon nitride layer and a second oxide layer over the gate electrode and the substrate;

(c) etching the second oxide layer to form an oxide spacer over the silicon nitride layer, wherein a bottom surface of the oxide spacer is placed at substantially an equal level with a top surface of the gate electrode;

(d) using the oxide spacer as a mask, etching the silicon nitride layer to form a silicon nitride spacer over the first oxide layer and around the gate electrode to expose the first oxide layer, wherein the silicon nitride spacer exposes a portion of the substrate located between the isolation structure and the silicon nitride spacer, wherein the silicon nitride spacer is not removed in any subsequent step;

(e) removing the oxide spacer and the exposed first oxide layer; and (f) performing an implanting step on the portion of the substrate.

20. The method of claim 19, wherein the bottom surface of the oxide spacer formed in step (c) is substantially coplanar with the top surface of the gate electrode.

21. The method of claim 20, wherein a top surface of the silicon nitride spacer formed in step (d) is substantially coplanar with the top surface of the gate electrode and supports the bottom surface of the oxide spacer formed in step (c).

22. The method of claim 21, wherein the silicon nitride spacer formed in step (d) defines a substantially square cross-sectional shape.

23. The method of claim 19, wherein a cross-section of the oxide spacer formed in step (c) has a longitudinal axis substantially perpendicular to a plane defined by the top surface of the gate electrode.

24. The method of claim 1, wherein the bottom surface of the oxide spacer formed in step (c) is substantially planar to the top surface of the gate electrode.

25. The method of claim 24, wherein a top surface of the silicon nitride spacer formed in step (d) is substantially coplanar with the top surface of the gate electrode and supports the bottom surface of the oxide spacer formed in step (c).

26. The method of claim 24, wherein the silicon nitride spacer formed in step (d) defines a substantially square cross-sectional shape.

27. The method of claim 1, wherein a cross-section of the oxide spacer formed in step (c) has a longitudinal axis substantially perpendicular to a plane defined by the top surface of the gate electrode.

* * * * *